(12) United States Patent
Plett

(10) Patent No.: US 6,534,954 B1
(45) Date of Patent: Mar. 18, 2003

(54) METHOD AND APPARATUS FOR A BATTERY STATE OF CHARGE ESTIMATOR

(75) Inventor: Gregory L. Plett, Colorado Springs, CO (US)

(73) Assignee: Compact Power Inc., Monument, CO (US)

(*) Notice: Subject to any disclaimer, the term of this patent is extended or adjusted under 35 U.S.C. 154(b) by 0 days.

(21) Appl. No.: 10/044,278

(22) Filed: Jan. 10, 2002

(51) Int. Cl.$^7$ .......................... H01M 10/44; H01M 10/46
(52) U.S. Cl. .......................... 320/132; 324/433
(58) Field of Search .................. 320/127, 128, 320/132, 149, DIG. 21; 324/427, 430, 433; 340/635, 636

(56) References Cited

U.S. PATENT DOCUMENTS 5,606,242 A * 2/1997 Hull et al.
5,652,502 A * 7/1997 Van Phuoc et al.
5,796,239 A * 8/1998 Van Phuoc et al.

* cited by examiner

Primary Examiner—Edward H. Tso
(74) Attorney, Agent, or Firm—J. D. Harriman, II, Esq.; Coudert Brothers LLP

(57) ABSTRACT

The present invention relates to an implementation of a battery State of Charge (SOC) estimator for any battery type. It addresses the problems associated with the existing implementations such as high error uncertainty, limited application (i.e. only one battery type) and susceptibility to temperature changes. Embodiments of the present invention use Kalman filter or Extended Kalman filter for a battery model that has SOC as an internal system state. Having an SOC internal state allows the invention to provide an uncertainty associated with its SOC estimation. One embodiment does not take battery temperature as a parameter in its SOC estimation. Another embodiment uses battery temperature as a parameter to adjust its SOC estimation to keep the accuracy of the SOC estimation from being affected by changing temperature. One embodiment allows different modeling parameters during battery operation to accommodate highly dynamic batteries used in Hybrid Electric Vehicles and Electric Vehicles.

34 Claims, 10 Drawing Sheets

(251) Predict the internal state vector

$$\hat{x}_{k+1}(-) = f(\hat{x}_k(+), u_k, 0)$$

(252) Predict the uncertainty

$$\Sigma_{e,k+1}(-) = A_k \Sigma_{e,k}(+) A_k^T + \Sigma_w$$

(261) Compute the Kalman Gain

$$L_k = \Sigma_{e,k}(-) C_k^T [C_k \Sigma_{e,k}(-) C_k^T + \Sigma_v]^{-1},$$

(262) Correct the predicted internal state vector with measurement $y_k$

$$\hat{x}_k(+) = \hat{x}_k(-) + L_k [y_k - h(\hat{x}_k(-), u_k, 0)].$$

(263) Correct the predicted uncertainty

$$\Sigma_{e,k}(+) = (I - L_k C_k) \Sigma_{e,k}(-).$$

202

FIGURE 2B (451) Predict the internal
state vector $$\hat{x}_{k+1}(-) = f(\hat{x}_k(+), i_k, 0)$$

(452) Predict the
uncertainty $$\Sigma_{e,k+1}(-) = A\Sigma_{e,k}(+)A^T + \Sigma_w$$

(461) Compute the
Kalman Gain $$L_k = \Sigma_{e,k}(-)C^T [C\Sigma_{e,k}(-)C^T + \Sigma_v]^{-1},$$

(462) Correct the
predicted internal state
vector with
measurement $m_k$ $$\hat{x}_k(+) = \hat{x}_k(-) + L_k[m_k - h(\hat{x}_k(-), i_k, 0)].$$

(463) Correct the
predicted uncertainty $$\Sigma_{e,k}(+) = (I - L_k C)\Sigma_{e,k}(-).$$

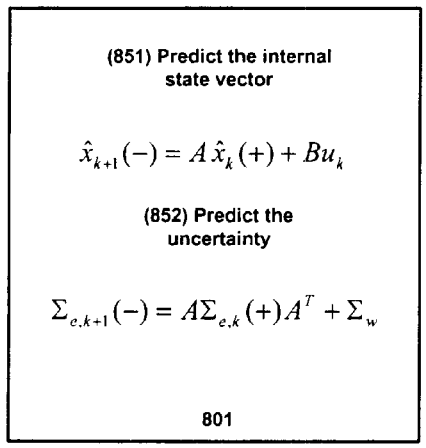

FIGURE 8A

(851) Predict the internal state vector $$\hat{x}_{k+1}(-) = A\hat{x}_k(+) + Bu_k$$

(852) Predict the uncertainty $$\Sigma_{e,k+1}(-) = A\Sigma_{e,k}(+)A^T + \Sigma_w$$

801

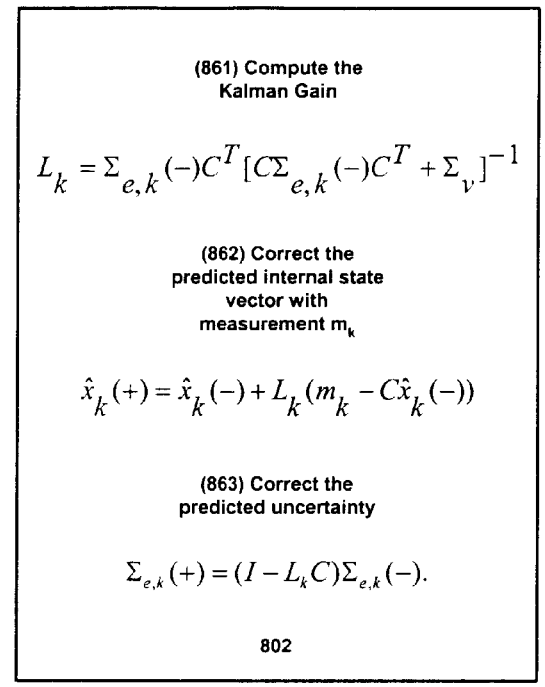

FIGURE 8B

(861) Compute the Kalman Gain $$L_k = \Sigma_{e,k}(-)C^T[C\Sigma_{e,k}(-)C^T + \Sigma_v]^{-1}$$

(862) Correct the predicted internal state vector with measurement $m_k$ $$\hat{x}_k(+) = \hat{x}_k(-) + L_k(m_k - C\hat{x}_k(-))$$

(863) Correct the predicted uncertainty $$\Sigma_{e,k}(+) = (I - L_k C)\Sigma_{e,k}(-).$$

802

METHOD AND APPARATUS FOR A BATTERY STATE OF CHARGE ESTIMATOR

BACKGROUND OF THE INVENTION

1. Field of the Invention

The present invention relates to the implementation of a battery State of Charge (SOC) estimator.

2. Background Art

Batteries are used in a wide variety of electronic and electrical devices. In each application, it is often useful and necessary to measure how much charge is left in the battery. Such a measurement is called the State of Charge (SOC). It is useful, for example, for a cell phone user to know how much longer he can talk on his phone. On the other hand, recharging devices need to know how much charge is in a battery to prevent overcharging. Many types of battery are sensitive to overcharging as well as undercharging. Overcharging and undercharging can erode the effectiveness of batteries and even damage them.

Currently there are many techniques that measure the remaining charge of a battery. Each of these SOC determination techniques has drawbacks. Some such as Amperehour counting are sensitive to measurement errors. Others such as Coup de fouet work for only One type of battery. Still other techniques such as Impedance Spectroscopy are constrained by battery conditions such as rapidly changing temperature. Also many do not give an uncertainty range in their estimation of the SOC. In applications such as HEV and EV batteries, the uncertainty range associated with the SOC measurement is very critical. Vehicles can lose power on the road and cause danger if the uncertainty range is unknown and the battery is erroneously undercharged. Knowing the uncertainty range can prevent this. For example if the battery SOC is determined to be within 10% of the minimum charge threshold and the uncertainty range is known to be 15%, the system will know to charge the battery because the uncertainty range is greater than the distance to the threshold.

Existing Techniques

Presented here is an overview of the existing techniques and some of their shortcomings. One technique called the discharge test is an accurate form of testing. It involves completely discharging the battery to determine the SOC under controlled conditions. However, the complete discharge requirement renders this test impractical for real-life application. It is too time consuming to be useful and interrupts system function while the test is being performed.

Another SOC determination technique is called Amperehour counting. This is the most common technique for determining the SOC because of its ease of implementation. It measures the current of the battery and uses the measurement to determine what the SOC is. Ampere-hour counting uses the following:

$$SOC = SOC_0 + \frac{1}{C_N} \int_0^t (I_{batt} - I_{loss}) dt \qquad (1)$$

where $C_N$ is the rated capacity of the battery, $I_{batt}$ is the battery current, and $I_{loss}$ is the current consumed by the loss reactions. The equation determines the SOC based on an initial $SOC_0$ starting point. Ampere-hour counting is essentially an "open loop" method that is easily confused. Measurement error accumulates over time to degrade the accuracy of SOC determination. There are methods to improve current measurement but they are expensive.

Electrolyte Measurement is another common technique. In lead-acid batteries, for example, the electrolyte takes part in reactions during charge and discharge. Thus, a linear relationship exists between the change in acid density and the SOC. Therefore measuring the electrolyte density can yield an estimation of the SOC. The density is measured directly or indirectly by ion-concentration, conductivity, refractive index, viscosity, etc. However, this technique is only feasible for vented lead-acid batteries. Furthermore it is susceptible to acid stratification in the battery, water loss and long term instability of the sensors.

An open-circuit voltage measurement may be performed to test the SOC of the battery. Although the relationship between the open circuit voltage and the SOC is non-linear, it may be determined via lab testing. Once the relationship is determined, the SOC can be determined by measuring the open circuit voltage. However the measurement and estimation are accurate only when the battery is at a steady state, which can be achieved only after a long period of inactivity. This makes the open-circuit voltage technique impractical for dynamic real time application.

Impedance Spectroscopy is another technique used to determine the SOC. Impedance spectroscopy has a wide variety of applications in determining the various characteristics of batteries. Impedance Spectroscopy exploits a relationship between battery model parameters derived from impedance spectroscopy measurements and the SOC. However the drawback of this technique is that impedance curves are strongly influenced by temperature effects. Thus its application is limited to applications where temperature is stable.

Internal resistance is a technique related to impedance spectroscopy. Internal resistance is calculated as the voltage drop divided by the current change during the same time interval. The time interval chosen is critical because any time interval longer than 10 ms will result in a more complex resistance measurement. Measurement of internal resistance is very sensitive to measurement accuracy. This requirement is especially difficult to achieve in Hybrid Electric Vehicle (HEV) and Electric Vehicle (EV) applications.

Some techniques use non-linear modeling to estimate SOC directly from measurements. An example is artificial neural networks. Artificial neural networks operate on any system and predict the relationship between input and output. The networks have to be trained repeatedly so that it can improve its estimation. Because the accuracy of the data is based on the training program for the networks, it is difficult to determine the error associated with the SOC prediction given by artificial neural networks.

There is another group of SOC estimation techniques called the interpretive techniques. Interpretive techniques do not give SOC directly. Instead they use electrical discharge and charge characteristics to determine the SOC. As such, the SOC must be inferred from the calculated values. One of these techniques is called the Coup de fouet. Coup de fouet describes the short voltage drop region occurring at the beginning of discharge following a full charge of lead-acid battery. Using a special correlation between the voltage parameters occurring in this Coup de fouet region, the SOC can be inferred. One limitation of the Coup de fouet technique is that it works for lead-acid batteries only. Moreover it is effective only in cases where full charge is frequently reached during battery operations.

The Kalman Filter

One SOC determination technique involves mathematically modeling the behavior of the battery and predicting the SOC based on the model. One such model is the Kalman filter. It has mathematical basis in statistics, probabilities and system modeling. The main purpose of the Kalman filter is to predict recursively the internal states of a dynamic system using only the system's outputs. In many instances this is very useful because the internal states of the system are unknown or cannot be directly measured. As such, the Kalman filter can work on all types of batteries and addresses a limitation of many aforementioned techniques.

The Kalman filter has been widely used in fields such as aerospace and computer graphics because it has several advantages over many other similar mathematical system models. In particular, the Kalman filter takes into account both measurement uncertainty and estimation uncertainty when it updates its estimation in successive steps. The Kalman filter corrects both uncertainties based on new measurements received from sensors. This is very important for two reasons. First, sensors often have a noise factor, or uncertainty, associated with its measurement. Over time, if uncorrected, the measurement uncertainty can accumulate. Second, in any modeling system the estimation itself has inherent uncertainty because the internal dynamic of the system may change over time. The estimation of one time step may be less accurate than the next because the system may have changed internally to behave less similarly to the model. The correction mechanism in the Kalman filter minimizes these uncertainties at each time step and prevents them from degrading accuracy over time.

FIG. 1. shows the basic operation of the Kalman filter. There are two main components in the Kalman filter—predict component 101 and correct component 102. To start, a set of initial parameters are fed into predict component 101. Predict component 101 predicts the internal states of the system at a particular point in time using a set of input parameters. Besides predicting the internal states, it also gives the uncertainty of its prediction. Thus, as shown in FIG. 1, the two outputs of predict component 101 are the predicted internal state vector (which encompasses the internal states) and its uncertainty.

The role of correct component 102 is to correct the predicted internal states and uncertainty it receives from predict component 101. The correction is made by comparing the predicted internal states and predicted uncertainty with new measurements received from sensors. The result are the corrected internal states and corrected uncertainty, both of which are then fed back as parameters to predict component 101 for the next iteration. At the next iteration, the cycle repeats itself over again.

Mathematical Basis of Kalman Filter

FIG. 1A and FIG. 1B show the equations used within both predict and correct components of the Kalman Filter. To understanding the origin of equations used, consider a dynamic process described by an n-th order difference equation of the form $$y_{k+1} = a_{0,k}y_k + \ldots + a_{n-1,k}y_{k-n+1} + u_k, \quad k \geq 0, \quad (2)$$

where $u_k$ is a zero-mean white random process noise. Under some basic conditions, this difference equation can be re-written as $$\vec{x}_{k+1} \equiv \begin{bmatrix} y_{k+1} \\ y_k \\ y_{k-1} \\ \vdots \\ y_{k-n+2} \end{bmatrix} = \underbrace{\begin{bmatrix} a_{0,k} & a_{1,k} & \cdots & a_{n-2,k} & a_{n-1,k} \\ 1 & 0 & \cdots & 0 & 0 \\ 0 & 1 & \cdots & 0 & 0 \\ \vdots & \vdots & \cdots & \vdots & \vdots \\ 0 & 0 & \cdots & 1 & 0 \end{bmatrix}}_{A} \underbrace{\begin{bmatrix} y_k \\ y_{k-1} \\ y_{k-2} \\ \vdots \\ y_{k-n+1} \end{bmatrix}}_{\vec{x}_k} + \underbrace{\begin{bmatrix} 1 \\ 0 \\ 0 \\ \vdots \\ 0 \end{bmatrix}}_{B} u_k \quad (3)$$

in which $\vec{x}_{k+1}$ represents a new state modeled by a linear combination of the previous state $\vec{x}_k$ and input $u_k$. Note the notation of matrices A and B. This leads to the state-space model $$\vec{x}_{k+1} = A_k \vec{x}_k + B_k u_k \quad (4)$$

$$\vec{y}_i = [1 \ 0 \ \ldots \ 0]\vec{x}_i \quad (5)$$

or the more general form $$\vec{x}_{k+1} = A_k \vec{x}_k + B_k u_k \quad (6)$$

$$\vec{y}_k = C_k \vec{x}_k + D_k u_k \quad (7)$$

which is the basis of many linear estimation models. While equations (3) to (5) assume a system with a single input and a single output, the general form in equations (6), (7) and the following equations allow multiple inputs and outputs if B has multiple columns and C has multiple rows.

Building on equations (6) and (7), the Kalman filter is governed by the equations $$x_k = Ax_{k-1} + Bu_{k-1} + w_{k-1} \quad (8)$$

$$y_k Cx_k + Du_k + v_k. \quad (9)$$

Equation (9) is in a more general form, though D is often assumed to be 0. The matrices A and B in equation (8) relate to matrices $A_k$ and $B_k$ in equation (6), respectively. The matrices C and D in equation (9) relate to matrices $C_k$ and $D_k$ in equation (7). As equation (8) governs the estimation of the dynamic system process, it is called the process function. Similarly since equation (9) governs the estimation of the measurement uncertainty, it is called the measurement function. The added random variables $w_k$ and $v_k$ in equation (8) and (9) represent the process noise and measurement noise, respectively. Their contribution to the estimation is represented by their covariance matrices $\Sigma_w$ and $\Sigma_v$ in FIGS. 1A and 1B.

Referring again to FIG. 1A (which shows equations in predict component 101), equation 151 is based on equation (8) and equation 152 is based on in part on equation (9). Equation 151 takes closely after the form of equation (8) but the necessary steps to transform equation (9) into the form shown in equation 152 are not shown here. Equation 151 predicts the internal states of the system in the next time step, represented vector by $\hat{x}_{k+1}(-)$, using parameters from the current time step. The minus notation denotes that the vector is the result of the predict component. The plus notation denotes that the vector is the result of the correct component. Hence in equation 151, the result of the correct component in the current time step is used to predict the result for the next time step. Equation 152 predicts the uncertainty, which is also referred to as the error covariance. As such, the matrix $\Sigma_w$ in equation 152 is the process noise covariance matrix.

FIG. 1B shows the equations within correct component 102. These three equations are executed in sequence. First, equation 161 determines the Kalman Gain factor. The Kalman Gain factor is used to calibrate the correction in equations 162 and 163. The matrix C in equation 161 is from that of equation (9), which relates the state to the measurement $y_k$. In equation 162, the Kalman Gain factor is used to weight between actual measurement $y_k$ and predicted measurement $C\hat{x}_k(-)$. As shown in equation 161, matrix $\Sigma_v$, the actual measurement-noise covariance, is inversely proportional to the Kalman Gain factor $L_k$. As $\Sigma_v$ decreases, $L_k$ increases and gives the actual measurement $y_k$ more weight. However, if $\Sigma_{e,k}(+)$, the predicted uncertainty, decreases, $L_k$ decreases and gives more weight to predicted measurement $C\hat{x}_k(-)$. Thus Kalman Gain factor favors either the actual measurement or predicted measurement, depending on which type of measurement has a smaller uncertainty.

Using this method of weighing measurement, equation 162 computes the corrected internal state vector $\hat{x}_k(+)$ based on predicted internal state vector $\hat{x}_k(-)$ (from predict component 101), new measurement $y_k$ and predicted measurement $C\hat{x}_k(-)$. Finally in the last equation of correct component 102, equation 163 corrects the predicted uncertainty, or the state-error covariance. Matrix I in equation 163 represents the identity matrix. The output of equations 162 and 163 are fed to predict component 101 for the next iteration. More specifically, the calculated value $\hat{x}_k(+)$ in equation 162 is substituted into equation 151 for the next iteration and the calculated value $\Sigma_{e,k}(+)$ in equation 163 is substituted into equation 152 for the next iteration. The Kalman filter thus iteratively predicts and corrects the internal states and its associated uncertainty. It must be noted that in practice, both A, B, C, D, $\Sigma_w$, and $\Sigma_v$, might change in each time step.

Extended Kalman Filter

Whereas the Kalman filter uses linear functions in its model, the Extended Kalman filter was developed to model system with non-linear functions. Aside from this distinction, the mathematical basis and operation for the Extended Kalman filter are essentially the same as the Kalman filter. The Extended Kalman filter uses an approximation model similar to the Taylor series to linearize the functions to obtain the estimation. The linearization is accomplished by taking the partial derivatives of the now non-linear process and measurement functions, the basis for the two equations in the predict component.

The Extended Kalman filter is governed by the following equations $$x_{k+1} = f(x_k, u_k, w_k) \quad (10)$$

and $$y_{k+1} = h(x_k, u_k, v_k) \quad (11)$$

where random variables $w_k$ and $v_k$ represent process noise and measurement noise, respectively. Non-linear function $f$ in equation (10) relates the internal state vector $x_k$ at the current step k to the internal state vector $x_{k+1}$ at the next time step k +1. Function $f$ also includes as parameters both the driving function $u_k$ and the process noise $w_k$. The non-linear function h in equation (11) relates the internal state vector $x_k$ and input $u_k$ to the measurement $y_k$.

FIG. 2A and FIG. 2B show the equations of the Extended Kalman Filter. The sequence of operation remains the same as the Kalman filter. There are still two components—predict component 201 and correct component 202. The equations are slightly different. Specifically, matrices A and C now have a time step sub-script k meaning that they change at each time step. This change is needed because the functions are now non-linear. We can no longer assume that the matrices are constant as in the case of the Kalman filter. To approximate them, Jacobian matrices are computed by taking partial derivatives of functions $f$ and h at each time step. The Jacobian matrices are listed below.

A is the Jacobian matrix computed by taking the partial derivative of $f$ with respect to x, that is $$A_{[i,j]k} = \left.\frac{\partial f_{[i]}}{\partial x_{[j]}}\right|_{x_k = \hat{x}_k} \quad (12)$$

The notation means "with $x_k$ evaluated as, or replaced by, $\hat{x}_k$ in final result."

C is the Jacobian matrix computed by taking the partial derivative of h with respect to x, that is $$C_{[i,j]k} = \left.\frac{\partial h_{[i]}}{\partial x_{[j]}}\right|_{x_k = \hat{x}_k} \quad (13)$$

Aside from these additional steps of taking partial derivatives of functions, the operation of the Extended Kalman filter remains essentially the same as the Kalman filter.

Using Kalman Filter to Determine the SOC in Batteries

Because it only has to measure the battery output, the Kalman filter has an advantage in that it works on all types of batteries system, including dynamic applications such as HEV and EV. There are existing applications that use the Kalman filter to determine SOC of batteries. However, none of them uses SOC as an internal state of the model. Thus the uncertainty associated with the SOC estimation cannot be determined. The defect is particularly important in HEV and EV batteries where the uncertainty range is needed to prevent undercharging of battery or loss of vehicle power. Also none of the existing methods uses the Extended Kalman filter to model battery SOC non-linearly.

It is important to note that as the Kalman filter is only a generic model. Each application of the Kalman filter still needs to use a good specific battery model and initial parameters that accurately describe the behavior of the battery to estimate the SOC. For example, to use the Kalman filter to measure the SOC as an internal state, the filter needs to have a specific equation describing how the SOC transitions from one time step to the next. The determination of such an equation is not trivial.

SUMMARY OF THE INVENTION

The present invention relates to an implementation of a battery State of Charge (SOC) estimator for any battery-powered application. The batteries may be either primary type or secondary (rechargeable) type. Moreover, the invention may be applied to any battery chemistry. It addresses the problems associated with the existing implementations such as high error uncertainty, limited range of applications (i.e. only one type of battery) and susceptibility to change in temperature.

Embodiments of the present invention use a Kalman filter, a linear algorithm, with a battery model that has SOC as an internal system state. Embodiments of the present invention use an Extended Kalman filter, a non-linear algorithm, with a battery model that has SOC as an internal system state. Having SOC as an internal state allows the invention to provide an uncertainty associated with its SOC estimation. Embodiments of the present invention do not take battery temperature as a parameter in its SOC estimation. Other embodiments of the present invention use battery temperature as a parameter to adjust its SOC estimation. This is important to keep the accuracy of the SOC estimation from being affected by changing temperature.

One embodiment has the option of allowing different modeling parameters during battery operation to accommodate highly dynamic batteries used in Hybrid Electric Vehicle (HEV) and Electric Vehicle (EV) where such previous implementations were difficult.

BRIEF DESCRIPTION OF THE DRAWINGS

These and other features, aspects and advantages of the present invention will become better understood with regard to the following description, appended claims and accompanying drawings where:

FIG. 2A shows the equations of the predict component of a generic Extended Kalman Filter.

FIG. 2B shows the equations of the correct component of a generic Extended Kalman Filter.

FIG. 4A shows the equations of the predict component of an implementation of the Extended Kalman Filter according to an embodiment of the present invention.

FIG. 4B shows the equations of the correct component of an implementation of the Extended Kalman Filter according to an embodiment of the present invention.

FIG. 8A shows the equations of the predict component of an implementation of the Kalman Filter according to an embodiment of the present invention.

FIG. 8B shows the equations of the correct component of an implementation of the Kalman Filter according to an embodiment of the present invention.

DETAILED DESCRIPTION OF THE INVENTION

Embodiments of the present invention relate to an implementation of a battery State of Charge (SOC) estimator for any battery-powered application.

The present invention may be applied to batteries of primary type or secondary (rechargeable) type. The invention may be applied to any battery chemistry. Embodiments of the present invention work on dynamic batteries used in Hybrid Electric Vehicle (HEV) and Electric Vehicle (EV) where previous implementations were difficult. It has the advantage of giving both the SOC estimate and the uncertainty of its estimation. It addresses the problems associated with the existing implementations such as high error uncertainty, limited range of applications and susceptibility to temperature changes.

Temperature-Independent Model

Figure 3A:
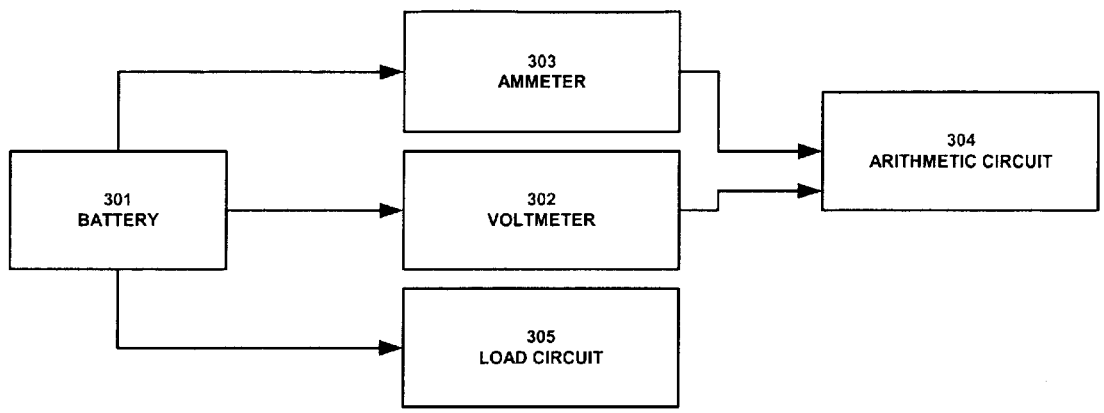
FIG. 3A shows the components of the SOC estimator according an embodiment of the present invention.

FIG. 3A shows the components of the SOC estimator according an embodiment of the present invention. Battery 301 is connected to load circuit 305. For example, load circuit 305 could be a motor in an Electric Vehicle (EV) or a Hybrid Electric Vehicle (HEV). Measurements of battery terminal voltage are made with voltmeter 302. Measurements of battery current are made with ammeter 303. Voltage and current measurements are processed with arithmetic circuit 304, which estimates the SOC. Note that no instrument is needed to take measurements from the internal chemical components of the battery. Also note that all measurements are non-invasive; that is, no signal is injected into the system that might interfere with the proper operation of load circuit 305.

Arithmetic circuit 304 uses a mathematical model of the battery that includes the battery SOC as a model state. In one embodiment of the present invention, a discrete-time model is used. In another embodiment a continuous-time model is used. In one embodiment, the model equations are $$x_{k+1} = f(x_k, i_k, w_k) \quad (14)$$

$$y_k = h(x_k, i_k, v_k) \quad (15)$$

where $x_k$ is the model state at time index k ($x_k$ may either be a scalar quantity or a vector), $i_k$ is the battery current at time index k, and $w_k$ is a disturbance input at time index k. The function $f(x_k, i_k, w_k)$ relates the model state at time index k to the model state at time index k+1, and may either be a linear or nonlinear function. Embodiments of the present invention have the battery SOC as an element of the model state vector $x_k$.

In equation (15), the variable $v_k$ is the measurement noise at time index k, and $y_k$ is the model's prediction of the battery terminal voltage at time index k. The function $h(x_k, i_k, v_k)$ relates the model's state, current and measurement noise to the predicted terminal voltage at time index k. This function may either be linear or nonlinear. The period of time that elapses between time indices is assumed to be fixed, although the invention allows measurements to be skipped from time to time.

Temperature-Dependent Model

Figure 3B:
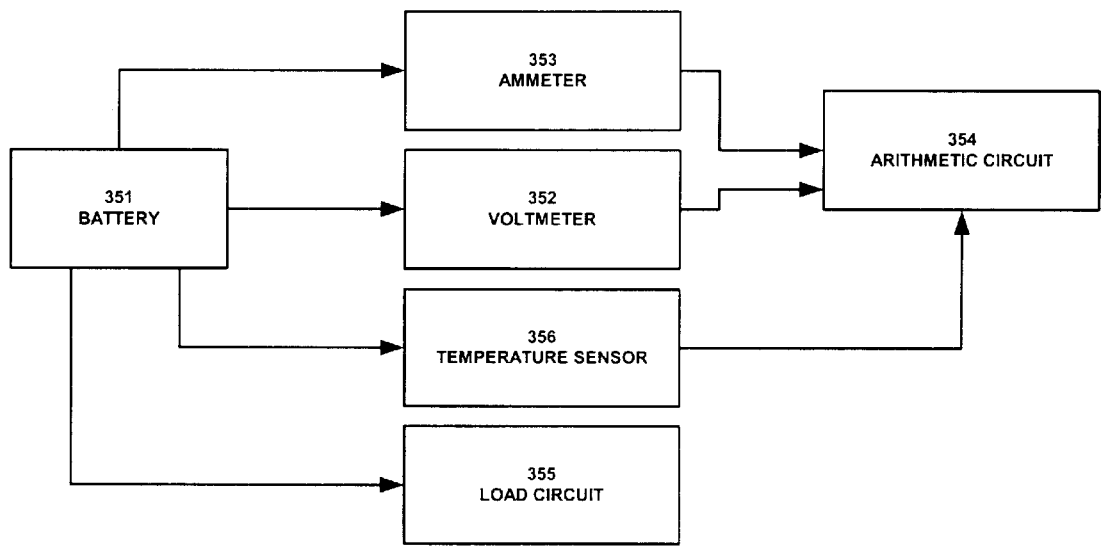
FIG. 3B shows the components of the SOC estimator according another embodiment of the present invention.

FIG. 3B shows the components of the SOC estimator according another embodiment of the present invention. Battery 351 is connected to load circuit 355. For example, load circuit 355 could be a motor in an Electric Vehicle (EV) or Hybrid Electric Vehicle (HEV). Measurements of battery terminal voltage are made with voltmeter 352. Measurements of battery current are made with ammeter 353. Battery temperature is measured by temperature sensor 356. Voltage, current and temperature measurements are processed with arithmetic circuit 354, which estimates the SOC.

Arithmetic circuit 354 uses a temperature dependent mathematical model of the battery that includes the battery SOC as a model state. In one embodiment of the present invention, a discrete-time model is used. In another embodi ment a continuous-time model is used. In one embodiment, the model equations are $$x_{k+1}=f(x_k,i_k,T_k,w_k) \quad (16)$$

$$y_k=h(x_k,i_k,T_k,v_k) \quad (17)$$

where $x_k$ is the model state at time index k ($x_k$ may either be a scalar quantity or a vector), $T_k$ is the battery temperature at time index k measured at one or more points within the battery pack, $i_k$ is the battery current at time index k, and $w_k$ is a disturbance input at time index k. The use of battery temperature as an dependent parameter is important to keep the accuracy of the. SOC estimation from being affected by changing temperature. The function $f(x_k,i_k,T_k,w_k)$ relates the model state at time index k to the model state at time index k+1, and may either be a linear or nonlinear function. Embodiments of the present invention have the battery SOC as an element of the model state vector $x_k$.

In equation (17), the variable $v_k$, is the measurement noise at time index k, and $y_k$ is the model's prediction of the battery terminal voltage at time index k. The function $h(x_k,i_k,T_k,v_k)$ relates the model's state, current and measurement noise to the predicted terminal voltage at time index k. This function may either be linear or nonlinear. The period of time that elapses between time indices is assumed to be fixed, although the invention allows measurements to be skipped from time to time.

Applying the Models to Kalman Filter and Extended Kalman Filter

In one embodiment of the present invention, the temperature-independent mathematical battery model of equations (14) and (15) is used as the basis for a Kalman filter to estimate the battery SOC as the system operates. The functions $f$ and h in this embodiment are linear. In another embodiment of the present invention, the temperature-dependent mathematical battery model of equations (16) and (17) is used as the basis for a Kalman filter to estimate the battery SOC as the system operates. The functions $f$ and h in this embodiment are also linear.

In another embodiment of the present invention, the temperature-independent mathematical battery model of equations (14) and (15) is used as a basis for an Extended Kalman filter. The functions $f$ and h in this embodiment are non-linear. In another embodiment of the present invention, the temperature-dependent mathematical battery model of equations (16) and (17) is used as a basis for an Extended Kalman filter. The functions $f$ and h in this embodiment are also non-linear. Those skilled in the art will recognize that other variants of a Kalman filter may also be used, as well as any Luenberger-like observer.

The Operation of the Extended Kalman Filter

FIG. 4A and FIG. 4B show an embodiment with an Extended Kalman filter. In this embodiment, equations (14) and (15) from the temperature-independent model is used as the basis of the Extended Kalman filter. Within the two figures, the equations within both the predict and correct components retain the generic form of the Extended Kalman Filter as shown in FIG. 2. However, in this embodiment there is some variation in the variable names. The differences reflect the use of equations (14) and (15) and the variables used in the battery SOC measurement. $\hat{x}_k(-)$ now represents the predicted vector representing the internal states of the battery while $\Sigma_{e,k}(-)$ is now the predicted state-error covariance (uncertainty). The functions $f$ and h are the same as those described in equations (14) and (15). Note also that in equation 462 of correct component 402, the actual measurement term is now denoted by $m_k$.

Figure 5A:
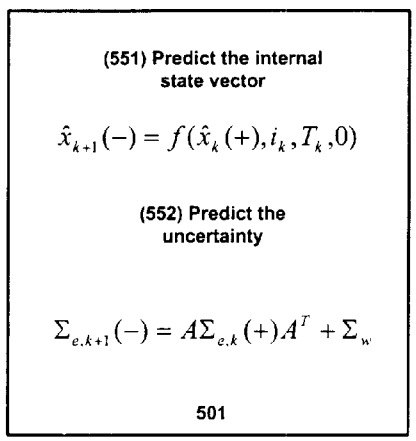
FIG. 5A shows the equations of the predict component of an implementation of the Extended Kalman Filter according to an embodiment of the present invention.
Figure 5B:
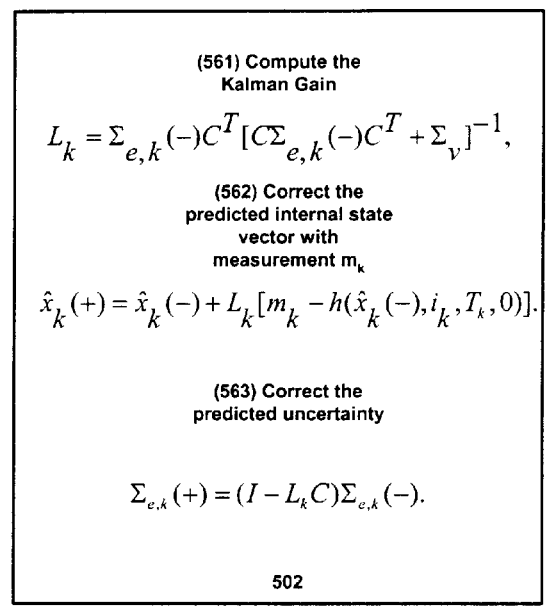
FIG. 5B shows the equations of the correct component of an implementation of the Extended Kalman Filter according to an embodiment of the present invention.

FIG. 5A and FIG. 5B show another embodiment with an Extended Kalman filter. In this embodiment, equations (16) and (17) from the temperature-dependent model is used as the basis of the Extended Kalman filter. All the equations are the same as those in FIG. 4A and FIG. 4B except that equation 551 and 562 now have an extra temperature term $T_k$. Thus at every iteration of the Extended Kalman filter in this embodiment, the temperature of the battery is used to determine the estimation. Since battery capacity is sometimes affected by the temperature, this extra term allows the equations to model the battery more accurately.

Figure 6:
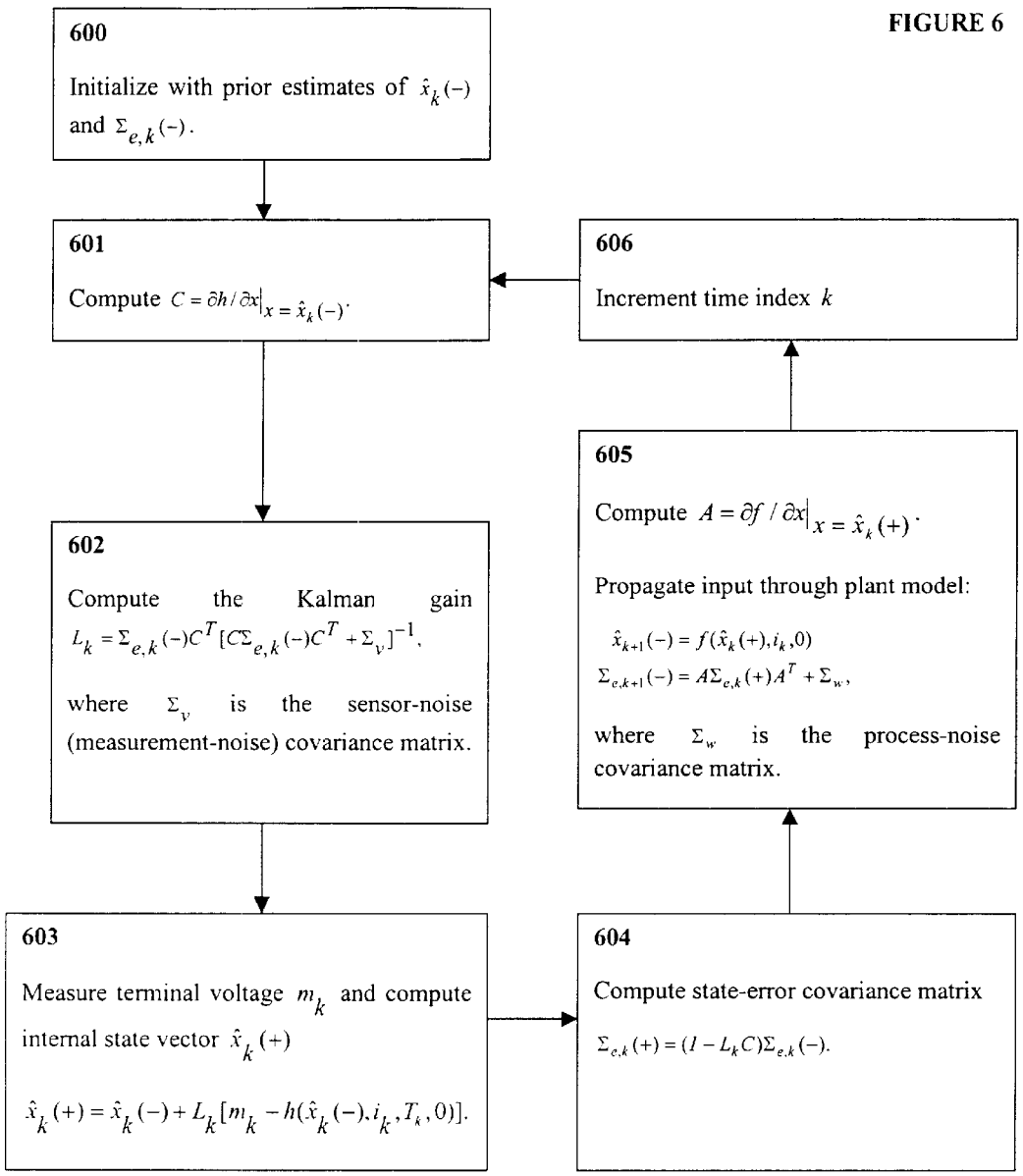
FIG. 6 shows the operation of an Extended Kalman Filter according an embodiment of the present invention.

FIG. 6. shows the operation of the Extended Kalman filter according to an embodiment of the present invention that uses the temperature-independent model. In block 600, an algorithm is initialized with prior estimates of $\hat{x}_k(-)$ and $\Sigma_{e,k}(-)$. $\hat{x}_k(-)$ is from function $f$ in equation (14) while $\Sigma_{e,k}(-)$ is from function h in equation (15). Upon the completion of block 600, with the estimates of $\hat{x}_k(-)$ and $\Sigma_{e,k}(-)$ the algorithm enters correct component of the Extended Kalman filter. The estimates $\hat{x}_k(-)$ and $\Sigma_{e,k}(-)$ serve as the output from the predict component needed by the correct component. In block 601, the partial derivative of the equation h with respect to x is computed, yielding matrix C. In block 602, the Kalman gain $L_k$ is computed using matrix C, $\hat{x}_k(-)$ and $\Sigma_{e,k}(-)$. This corresponds to the first equation (equation 461) of correct component 402 in FIG. 4B. Then in block 603, the predicted internal state vector $\hat{x}_k(-)$, the Kalman gain $L_k$ and the measurement from terminal voltage $m_k$ are used to calculate a corrected state vector $\hat{x}_k(+)$. This corresponds to the second equation of the correct component in the Extended Kalman filter. In block 604, the predicted state-error covariance $\Sigma_{e,k}(-)$ is used to compute a corrected state-error covariance $\Sigma_{e,k}(+)$ This corresponds to the third equation of the correct component.

In block 605, both of the equations of the predict component are computed. The matrix A is computed by taking the partial derivative of the function $f$ with respect to x Then the prediction for the next iteration is computed, namely $\hat{x}_{k+1}(-)$ and $\Sigma_{e,k+1}(-)$. In block 606 the time index k is incremented and the operation begins in block 601 again with the next time step.

Figure 7:
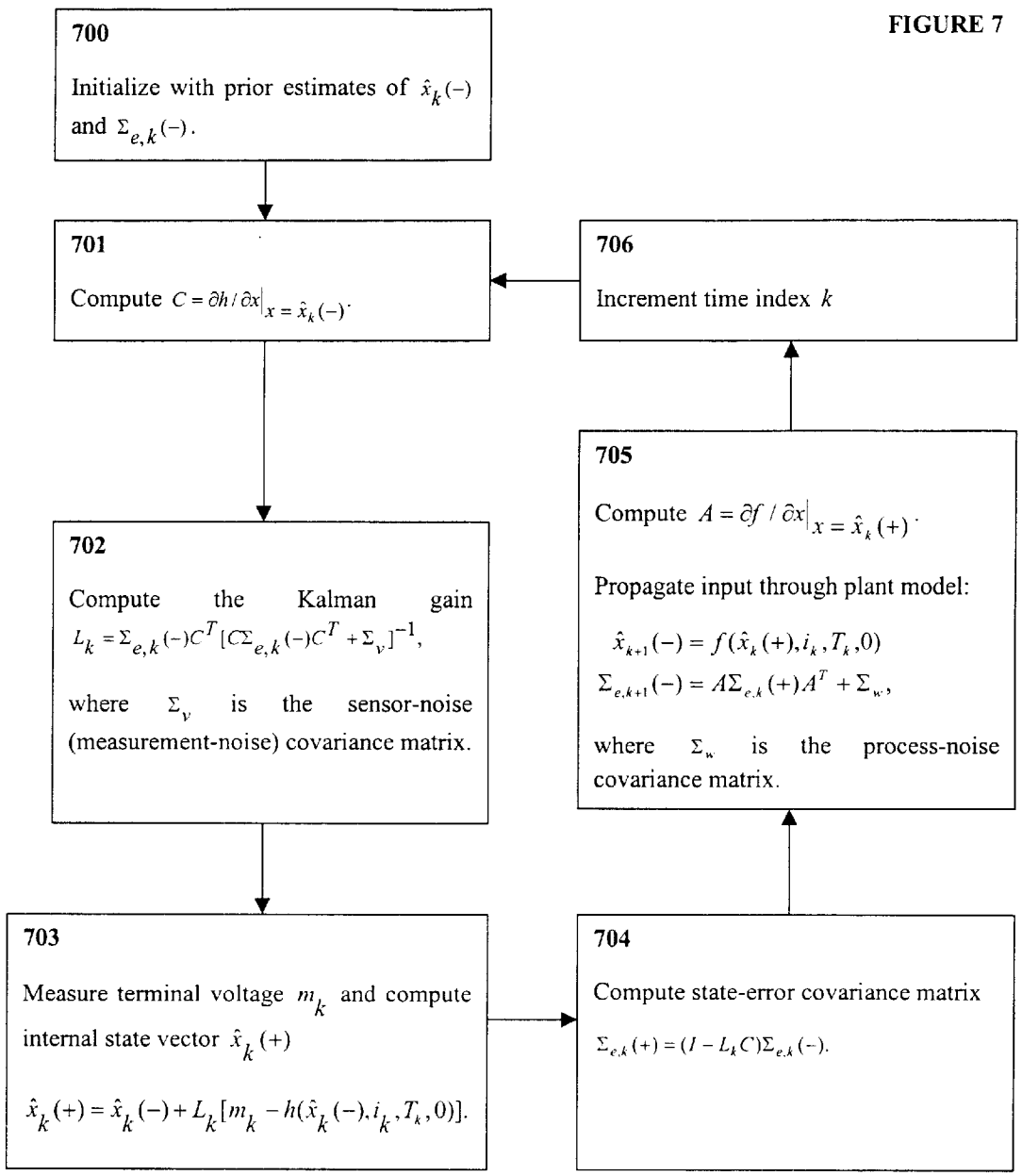
FIG. 7 shows the operation of an Extended Kalman Filter according another embodiment of the present invention.

FIG. 7. shows the operation of the Extended Kalman filter according to another embodiment of the present invention that uses the temperature-dependent model. In block 700, an algorithm is initialized with prior estimates of $\hat{x}_k(-)$ and $\Sigma_{e,k}(-)$ is from function $f$ in equation (16) while $\Sigma_{e,k}(-)$ is from function h in equation (17). Upon the completion of block 700, with the estimates of $\hat{x}_k(-)$ and $\Sigma_{e,k}(-)$, the algorithm enters correct component of the Extended Kalman filter. The estimates $\hat{x}_k(-)$ and $\Sigma_{e,k}(-)$ serve as the output from the predict component needed by the correct component. In block 701, the partial derivative of the equation h with respect to x is computed, yielding matrix C. In block 702, the Kalman gain $L_k$ is computed using matrix C, $\hat{x}_k(-)$ and $\Sigma_{e,k}(-)$. This corresponds to the first equation (equation 561) of correct component 502 in FIG 5B. Then in block 703, the predicted internal state vector $\hat{x}_k(-)$, the Kalman gain $L_k$ and the measurement from terminal voltage $m_k$ are used to calculate a corrected state vector $\hat{x}_k(+)$. This corresponds to the second equation of the correct component in the Extended Kalman filter. In block 704, the predicted state-error covariance $\Sigma_{e,k}(-)$ is used to compute a corrected state-error covariance $\Sigma_{e,k}(+)$ This corresponds to the third equation of the correct component.

In block 705, both of the equations of the predict component are computed. The matrix A is computed by taking the partial derivative of the function $f$ with respect to x.

Then the prediction for the next iteration is computed, namely $\hat{x}_{k+1}(-)$ and $\Sigma_{e,k+1}(-)$. In block 706 the time index k is incremented and the operation begins in block 701 again with the next time step.

The Operation of the Kalman Filter

Figure 1:
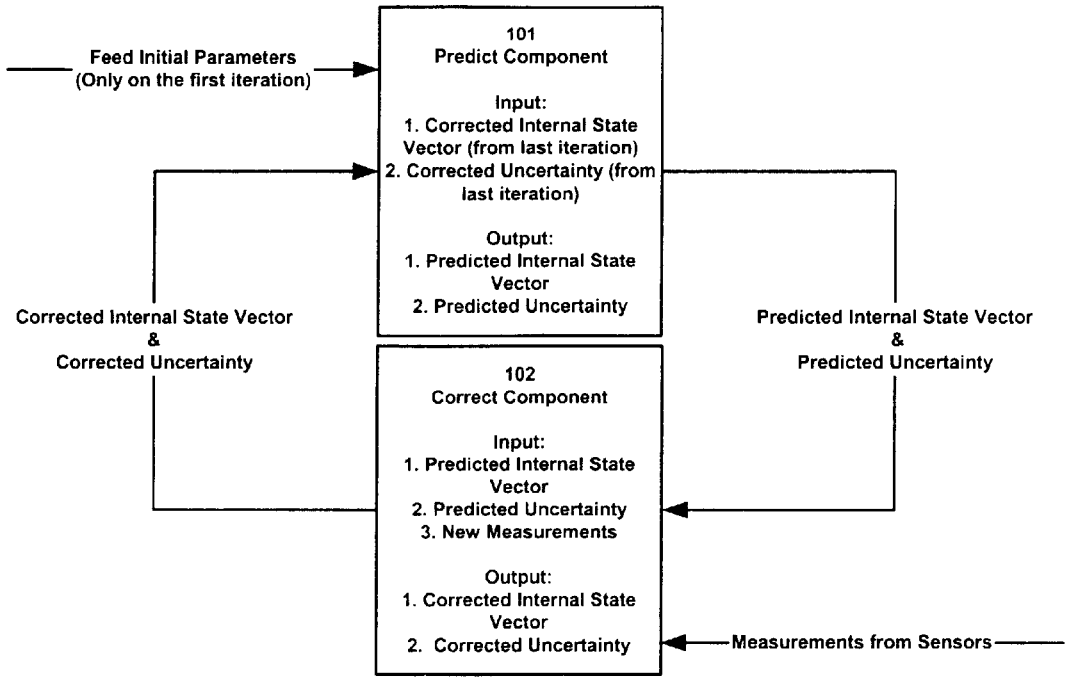
FIG. 1 shows the operation of a generic Kalman Filter.
Figure 1A:
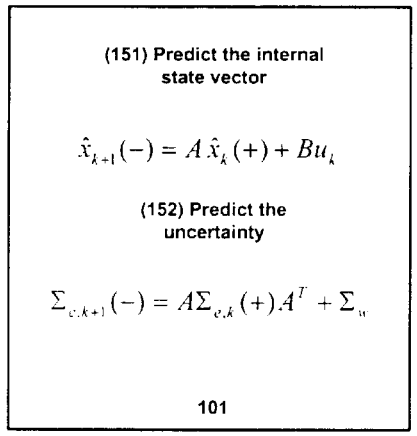
FIG. 1A shows the equations of a predict component of a generic Kalman Filter.
Figure 1B:
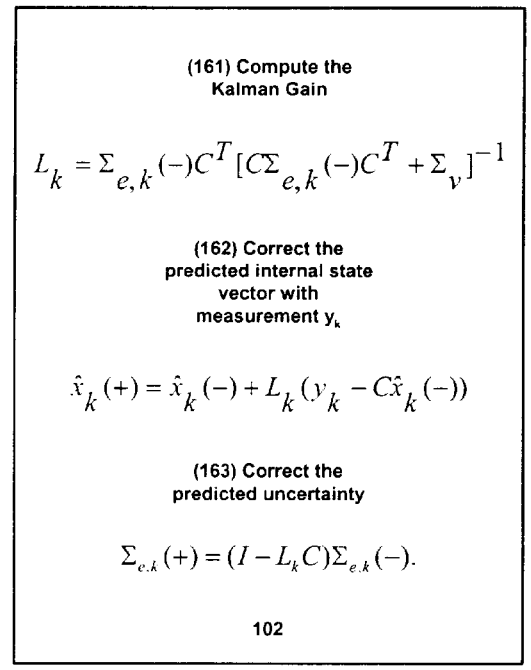
FIG. 1B shows the equations of a correct component of a generic Kalman Filter.

FIG. 8A and FIG. 8B show an embodiment with a Kalman filter. In one embodiment, equations (14) and (15) from the temperature-independent model is used as the basis of the Kalman filter. In another embodiment, equations (16) and (17) from the temperature-dependent model is used as the basis of the Kalman filter. Within the two figures, the equations within both the predict and correct components retain the generic form of the Kalman Filter as shown in FIG. 1. However, in this embodiment there is some variation in the variable names. In one embodiment, the differences reflect the use of equations (14) and (15) and the variables used in the battery SOC measurement. In another embodiment, the differences reflect the use of equations (16) and (17) and the variables used in the battery SOC measurement. $\hat{x}_k(-)$ now represents the predicted vector representing the internal states of the battery while $\Sigma_{e,k}(-)$ is now the predicted state-error covariance (uncertainty). Note also that in equation 862 of correct component 802, the actual measurement term is now denoted by $m_k$.

Figure 9:
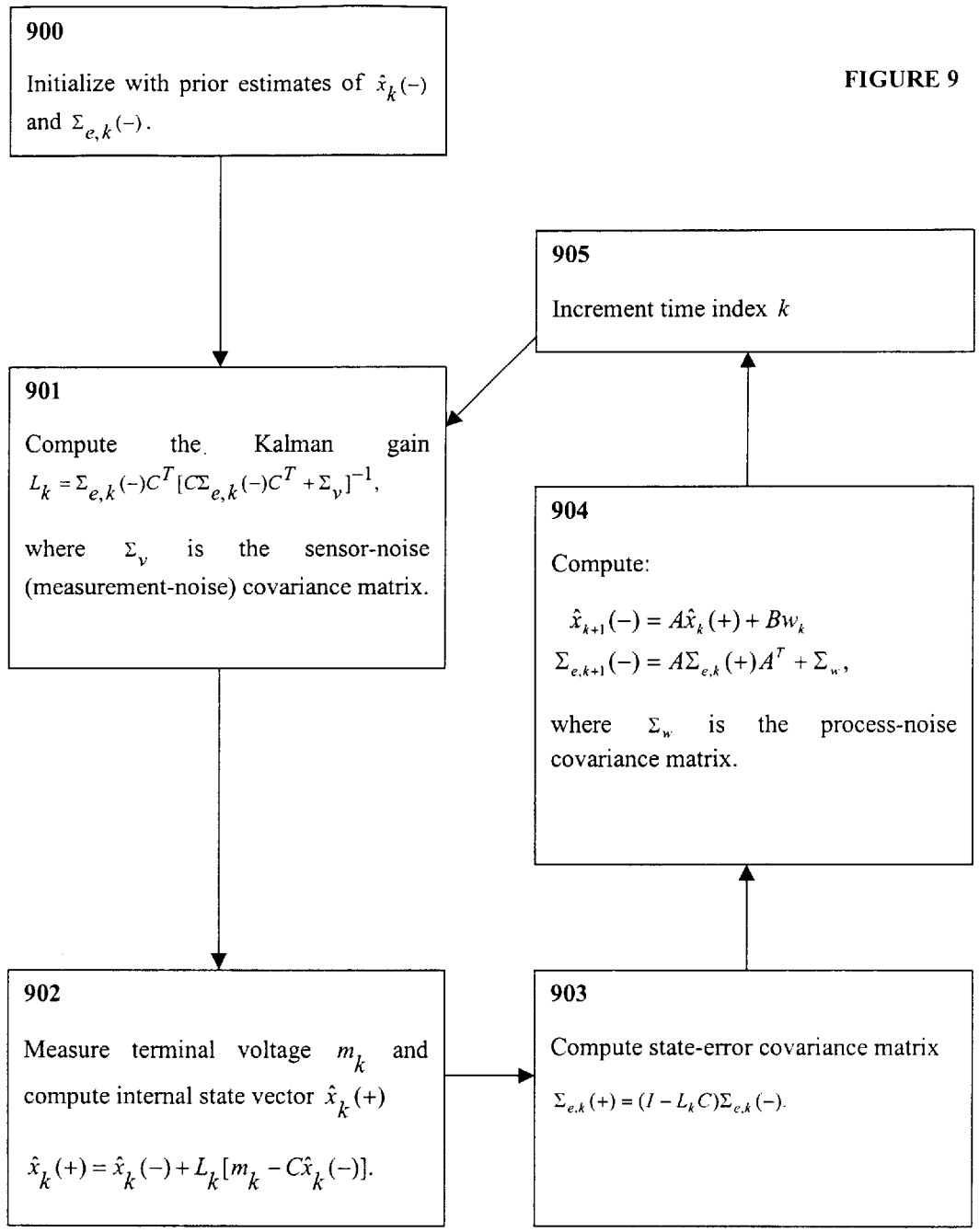
FIG. 9 shows the operation of a Kalman Filter according an embodiment of the present invention.

FIG. 9 shows the operation of the Kalman filter according to an embodiment of the present invention. In block 900, an algorithm is initialized with prior estimates of $\hat{x}_k(-)$ and. $\Sigma_{e,k}(-)$. In one embodiment, $\hat{x}_k(-)$ is from function $f$ in equation (14) while $\Sigma_{e,k}(-)$ is from function h in equation (15). This embodiment is temperature-independent. In another. embodiment, $\hat{x}_k(-)$ is from function $f$ in equation (16) while $\Sigma_{e,k}(-)$ is from function h in equation (17). This embodiment is temperature-dependent. Upon the completion of block 900, with the estimates of $\hat{x}_k(-)$ and $\Sigma_{e,k}(-)$, the algorithm enters correct component of the Kalman filter. The estimates $\hat{x}_k(-)$ and $\Sigma_{e,k}(-)$ serve as the output from the predict component needed by the correct component. In block 901 the Kalman gain $L_k$ is computed using matrix C, $\hat{x}_k(-)$ and $\Sigma_{e,k}(-)$. This corresponds to the first equation (equation 861) of correct component 802 in FIG. 8B. Then in block 902 the predicted internal state vector $\hat{x}_k(-)$, the Kalman gain $L_k$ and the measurement from terminal voltage $m_k$ are used to calculate a corrected state vector $\hat{x}_k(+)$. This corresponds to the second equation of the correct component in the Kalman filter. In block 903, the predicted state-error covariance $\Sigma_{e,k}(-)$ is used to compute a corrected state-error covariance $\Sigma_{e,k}(+)$. This corresponds to the third equation of the correct component. In block 904, both of the equations of the predict component are calculated. Then the prediction for the next iteration is computed, namely $\hat{x}_{k+1}(-)$ and $\Sigma_{e,k+1}(-)$ In block 905 the time index k is incremented and the operation begins in block 901 again with the next time step.

Specific Equations

In one embodiment, the following specific form of function $f$ is used. The internal state vector $x_k$ is:

$$x_k = \begin{bmatrix} SOC_k \\ FILT_k \\ IF1_k \\ IF2_k \end{bmatrix} \quad (18)$$

and the governing equation for each state is:

$$SOC_{k+1} = SOC_k - \eta(I_k)|I_k|^n \Delta t / C_p(temp...) \quad (19)$$

$$FILT_{k+1} = SOC_k + k_i FILT_k + k_5$$

$$IF_{k+1} = \begin{bmatrix} a_1 & a_2 \\ -a_2 & a_1 \end{bmatrix} IF_k + \begin{bmatrix} 0 \\ 1 \end{bmatrix} \eta(I_k)|I_k|^n \Delta t / C_p(temp...).$$

The battery SOC is the first element of the state vector. The variables are defined as follows: $I_k$ is the instantaneous current, $\Delta t$ is the interval between time instants, $C_p$ (temp . . . ) is the "Peukert" capacity of the battery adjusted to be temperature-dependent, n is the Peukert exponent related to the Peukert. capacity, and $\eta(I_k)$ is the battery coulombic efficiency as a function of current. The state variables FILT and IF are filter states that capture most of the smooth slow dynamics of the battery.

In one embodiment, the following specific form of function h is used:

$$y_k = k_0 FILT_k + k_1 + k_2 I_k + k_3/(SOC_k + k_6) + k_4 SOC_k + [c_1 c_2]IF_k. \quad (20)$$

where $y_k$ is the terminal voltage. All other variables ($k_0, k_1$, etc) are coefficients of the model, which may be determined a priori from lab tests and may be adjusted during system operation using mechanisms not discussed here. These coefficients vary in the present invention so that the coefficients used for an instantaneous discharge of 10 Amps would be different from those used for an instantaneous charge of 5 Amps, for example. This allows the invention to more precisely model the current-dependence of the model.

In another embodiment, the following form of function $f$ is used. The internal state vector $x_k$ is $$x_k = \begin{bmatrix} SOC_k \\ SOC_{k-1} \\ \vdots \\ SOC_{k-\alpha} \\ i_k \\ i_{k-1} \\ \vdots \\ i_{k-\beta} \\ y_{k-1} \\ y_{k-2} \\ \vdots \\ y_{k-\gamma} \end{bmatrix} \quad (21)$$

where $SOC_k$ is the present SOC estimate, $SOC_{k-1}$ is the previous SOC estimate (and so forth), $i_k$ is the present current measurement (and so forth) and $y_{k-1}$ is the previous battery voltage estimate. $\alpha$, $\beta$ and $\gamma$ are positive constants chosen to make an acceptable model with a parsimonious number of state variables. The governing equation for the SOC state is:

$$SOC_{k+1} = SOC_k - \eta(I_k)|I_k|^n \Delta t / C_p(temp \ldots) \quad (22)$$

In the embodiment, the specific form of function h is used $$y_k = h(x_k, T_k), \quad (23)$$

where h is implemented as a nonlinear function fit to measured data. For example, h may be implemented using a neural network.

In one embodiment a neural network may be used to estimate the internal states of the battery. The difference between this embodiment and prior neural networks is as follows. In prior art neural networks, the estimated SOC is the output of the neural networks. This embodiment indirectly measures the SOC by first modeling the battery cell using a neural network with SOC as one of its states, and then uses a Kalman filter with the neural network to estimate SOC. This approach has two main advantages. First it can be trained on-line while it is in operation. Second, error bounds on the estimate may be computed.

Changing Parameters

Figure 10:
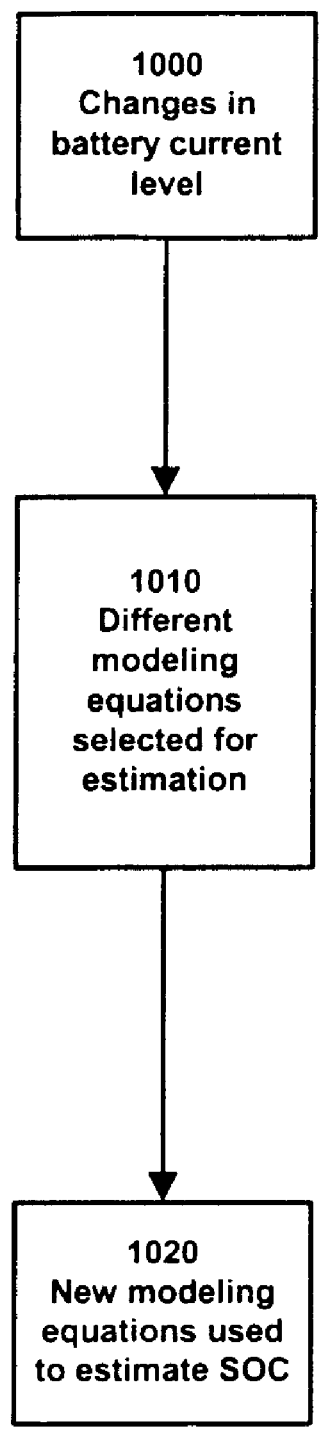
FIG. 10 shows the operation of an embodiment of the present invention that dynamically changes the modeling equations for the battery SOC.

FIG. 10 shows the operation of an embodiment of the present invention that dynamically changes modeling equations for the battery SOC. In this embodiment, the arithmetic circuit can accommodate changing behaviors of the battery to use different parameters for different time periods. In block 1000, a change in battery current level is detected. For example, in a Hybrid Electric Vehicle (HEV), a sudden drain in the battery power is caused by the vehicle going uphill. The sudden change in condition triggers the arithmetic circuit to use a different set of modeling equations to more accurately estimate the SOC in the new condition. In block 1010 a new set of modeling equations are used. In 1020, the new equations are used to determine the SOC. This adaptive modeling behavior is useful in highly dynamic applications such as in Hybrid Electric Vehicles (HEV) and Electric Vehicles (EV).

Thus, an implementation of battery charge estimator is described in conjunction with one or more specific embodiments. The invention is defined by the claims and their full scope of equivalents.

What is claimed is:

1. A method for estimating state-of-charge in a battery, comprising:

making an internal states prediction of said battery where said state-of-charge is one of said internal states;

making an uncertainty prediction of said internal states prediction;

correcting said internal states prediction and said uncertainty prediction; and applying an algorithm that iterates said making an internal states prediction, said making an uncertainty prediction and said correcting to yield an ongoing estimation to said state-of-charge and an ongoing uncertainty to said state-of-charge estimation.

2. The method of claim 1 where said making an internal states prediction comprises:

determining a current measurement;

determining a voltage measurement; and using said current measurement and said voltage measurement in a mathematical model to make said internal states prediction.

3. The method of claim 2 where said making an uncertainty prediction comprises using said current measurement and said voltage measurement in a mathematical model to make said uncertainty prediction.

4. The method of claim 3 where said correcting comprises:

computing a gain factor;

computing a corrected internal states prediction using said gain factor, said voltage measurement and said internal states prediction; and computing a corrected uncertainty prediction using said gain factor and said uncertainty prediction.

5. The method of claim 4 where said applying comprises using said corrected internal states prediction and said corrected uncertainty prediction to obtain predictions for the next time step where said algorithm repeats again.

6. The method of claim 5, where said algorithm is a Kalman Filter.

7. The method of claim 5, where said algorithm is an Extended Kalman Filter.

8. The method of claim 7, where said making an internal states prediction further comprises using different mathematical models for predictions based on changing battery conditions.

9. The method of claim 7, where said making an uncertainty prediction further comprises using different mathematical models for predictions based on changing battery conditions.

10. The method of claim 2 where said making an internal states prediction further comprises:

determining a temperature; and using said temperature measurement, said current measurement and said voltage measurement in a mathematical model to make said internal states prediction.

11. The method of claim 10 where said making an uncertainty prediction comprises using said temperature measurement, said current measurement and said voltage measurement in a mathematical model to make said uncertainity prediction.

12. The method of claim 11 where said correcting comprises:

computing a gain factor;

computing a corrected internal states prediction using said gain factor, said voltage measurement and said internal states prediction; and computing a corrected uncertainty prediction using said gain factor and said uncertainty prediction.

13. The method of claim 12 where said applying comprises using said corrected internal states prediction and said corrected uncertainty prediction to obtain predictions for the next time step where said algorithm repeats again.

14. The method of claim 13, where said algorithm is a Kalman Filter.

15. The method of claim 13, where said algorithm is an Extended Kalman Filter.

16. The method of claim 15, where said making an internal states prediction further comprises using different mathematical models for predictions based on changing battery conditions.

17. The method of claim 15, where said making an uncertainty prediction further comprises using different mathematical models for predictions based on changing battery conditions.

18. An apparatus for estimating state-of-charge in a battery, comprising:

a component configured to make an internal states prediction of said battery where said state-of-charge is one of said internal states;

a component configured to make an uncertainty prediction of said internal states prediction;

a component configured to correct said internal states prediction and said uncertainty prediction; and a component configured to apply an algorithm that iterates steps taken by said component configured to make an internal states prediction, said component configured to make an uncertainty prediction and said component configured to correct to yield an ongoing estimation to said state-of-charge and an ongoing uncertainty to said state-of-charge estimation.

19. The apparatus of claim 18 where said component configured to make an internal states prediction comprises:
   a component configured to determine a current measurement;
   a component configured to determine a voltage measurement; and
   a component configured to use said current measurement and said voltage measurement in a mathematical model to make said internal states prediction.

20. The apparatus of claim 19 where said component configured to make an uncertainty prediction comprises a component configured to use said current measurement and said voltage measurement in a mathematical model to make said uncertainty prediction.

21. The apparatus of claim 20 where said component configured to correct comprises:
   a component configured to compute a gain factor;
   a component configured to compute a corrected internal states prediction using said gain factor, said voltage measurement and said internal states prediction; and
   component configured to compute a corrected uncertainty prediction using said gain factor and said uncertainty prediction.

22. The apparatus of claim 21 where said component configured to apply comprises a component configured to use said corrected internal states prediction and said corrected uncertainty prediction to obtain predictions for the next time step where said algorithm repeats again.

23. The apparatus of claim 22, where said algorithm is a Kalman Filter.

24. The apparatus of claim 22, where said algorithm is an Extended Kalman Filter.

25. The apparatus of claim 24, where said component configured to make an internal states prediction further comprises a component configured to use different mathematical models for predictions based on changing battery conditions.

26. The apparatus of claim 24, where said component configured to make an uncertainty prediction further comprises a component configured to use different mathematical models for predictions based on changing battery conditions.

27. The apparatus of claim 19 where said component configured to make an internal states prediction further comprises:
   a component configured to determine a temerpature measurement; and
   a component configured to use said temperature measurement, said current measurement and said voltage measurement in a mathematical model to make said internal states prediction.

28. The apparatus of claim 27 where said component configured to make an uncertainty prediction comprises a component configured to use said temperature measurement, said current measurement and said voltage measurement in a mathematical model to make said uncertainty prediction.

29. The apparatus of claim 28 where said component configured to correct comprises:
   a component configured to compute a gain factor;
   a component configured to compute a corrected internal states prediction using said gain factor, said voltage measurement and said internal states prediction; and
   a component configured to compute a corrected. uncertainty prediction using said gain factor and said uncertainty prediction.

30. The apparatus of claim 28 where said component configured to apply comprises a component configured to use said corrected internal states prediction and said corrected uncertainty prediction to obtain predictions for the next time step where said algorithm repeats again.

31. The apparatus of claim 30, where said algorithm is a Kalman Filter.

32. The apparatus of claim 30, where said algorithm is an Extended Kalman Filter.

33. The apparatus of claim 32, where said component configured to make an internal states prediction further comprises a component configured to use different mathematical models for predictions based on changing battery conditions.

34. The apparatus of claim 32, where said component configured to make an uncertainty prediction further comprises a component configured to use different mathematical models for predictions based on changing battery conditions.

* * * * *